(12) United States Patent
Fujiie et al.

(10) Patent No.: US 7,190,641 B2
(45) Date of Patent: Mar. 13, 2007

(54) OPTICAL RECORDING, PRODUCING APPARATUS, AND METHOD WITH PEAK-HOLD VOLTAGE FEATURES

(75) Inventors: Kazuhiko Fujiie, Tokyo (JP); Yasuyuki Takeshita, Tokyo (JP)

(73) Assignee: Sony Corporation, Tokyo (JP)

( * ) Notice: Subject to any disclaimer, the term of this patent is extended or adjusted under 35 U.S.C. 154(b) by 486 days.

(21) Appl. No.: 10/169,734

(22) PCT Filed: Nov. 16, 2001

(86) PCT No.: PCT/JP01/10049

§ 371 (c)(1),
(2), (4) Date: Dec. 12, 2002

(87) PCT Pub. No.: WO02/41457

PCT Pub. Date: May 23, 2002

(65) Prior Publication Data

US 2005/0117615 A1 Jun. 2, 2005

(30) Foreign Application Priority Data

Nov. 17, 2000 (JP) .............................. 2000-351407

(51) Int. Cl.
*G11B 11/00* (2006.01)
(52) U.S. Cl. .................................. 369/13.24; 372/38.02
(58) Field of Classification Search ...................... None
See application file for complete search history.

(56) References Cited

U.S. PATENT DOCUMENTS

| 5,848,044 | A | * | 12/1998 | Taguchi et al. | .......... 369/53.26 |
| 5,878,015 | A |   | 3/1999  | Schell et al.  |                   |
| 6,011,768 | A | * | 1/2000  | Taguchi        | ....................... 369/116 |
| 6,031,855 | A | * | 2/2000  | Watanabe       | ................ 372/38.02 |
| 6,111,901 | A | * | 8/2000  | Taguchi et al. | .......... 372/38.02 |
| 6,118,798 | A | * | 9/2000  | Ema et al.     | ............. 372/29.011 |
| 6,320,890 | B1| * | 11/2001 | Taguchi        | .................... 372/38.02 |
| 6,339,579 | B1| * | 1/2002  | Kamioka et al. | ........... 369/121 |
| 6,345,062 | B1| * | 2/2002  | Taguchi et al. | .......... 372/38.01 |
| 6,414,932 | B1| * | 7/2002  | Kaku et al.    | ................. 369/116 |
| 6,442,118 | B1| * | 8/2002  | Hoshino et al. | ........... 369/47.3 |
| 6,483,791 | B1| * | 11/2002 | Asada et al.   | ............. 369/59.11 |
| 6,487,154 | B1| * | 11/2002 | Kurebayashi et al. | ..... 369/53.26 |
| 6,552,987 | B1| * | 4/2003  | Asada et al.   | ............. 369/59.11 |
| 6,810,050 | B2| * | 10/2004 | Nihei et al.   | .............. 372/38.02 |

FOREIGN PATENT DOCUMENTS

| JP | 6-275901    | 9/1994  |
| JP | 6-334247    | 12/1994 |
| JP | 10-012976   | 1/1998  |
| JP | 11-213426   | 8/1999  |
| JP | 2000-244052 | 9/2000  |

* cited by examiner

*Primary Examiner*—Tan Dinh
(74) *Attorney, Agent, or Firm*—Oblon, Spivak, McClelland, Maier & Neustadt, P.C.

(57) ABSTRACT

The present invention proposes a method of controlling the laser power of a semiconductor laser that, in this method of controlling the laser power of a semiconductor laser by applying a power source voltage to between the collector and emitter of an output transistor and a serial circuit of the output transistor and a semiconductor laser, enables decreasing the power consumption of the output transistor. The present invention is arranged to apply a variable power source voltage Vcc to a serial circuit of an output transistor (Qb) and a semiconductor laser (SL) and thereby control the variable power source voltage Vcc such that a difference between the variable power source voltage Vcc and the peak hold voltage of an operating voltage of the semiconductor laser (SL) becomes substantially constant.

31 Claims, 8 Drawing Sheets

FIG. 8 PRIOR ART

OPTICAL RECORDING, PRODUCING APPARATUS, AND METHOD WITH PEAK-HOLD VOLTAGE FEATURES

TECHNICAL FIELD

The present invention relates to a laser power controlling method and apparatus for a semiconductor laser, and a recording/reproducing method and apparatus for a magneto-optical recording medium, and a recording/reproducing method and apparatus for an optical recording medium.

BACKGROUND ART

Figure 6:
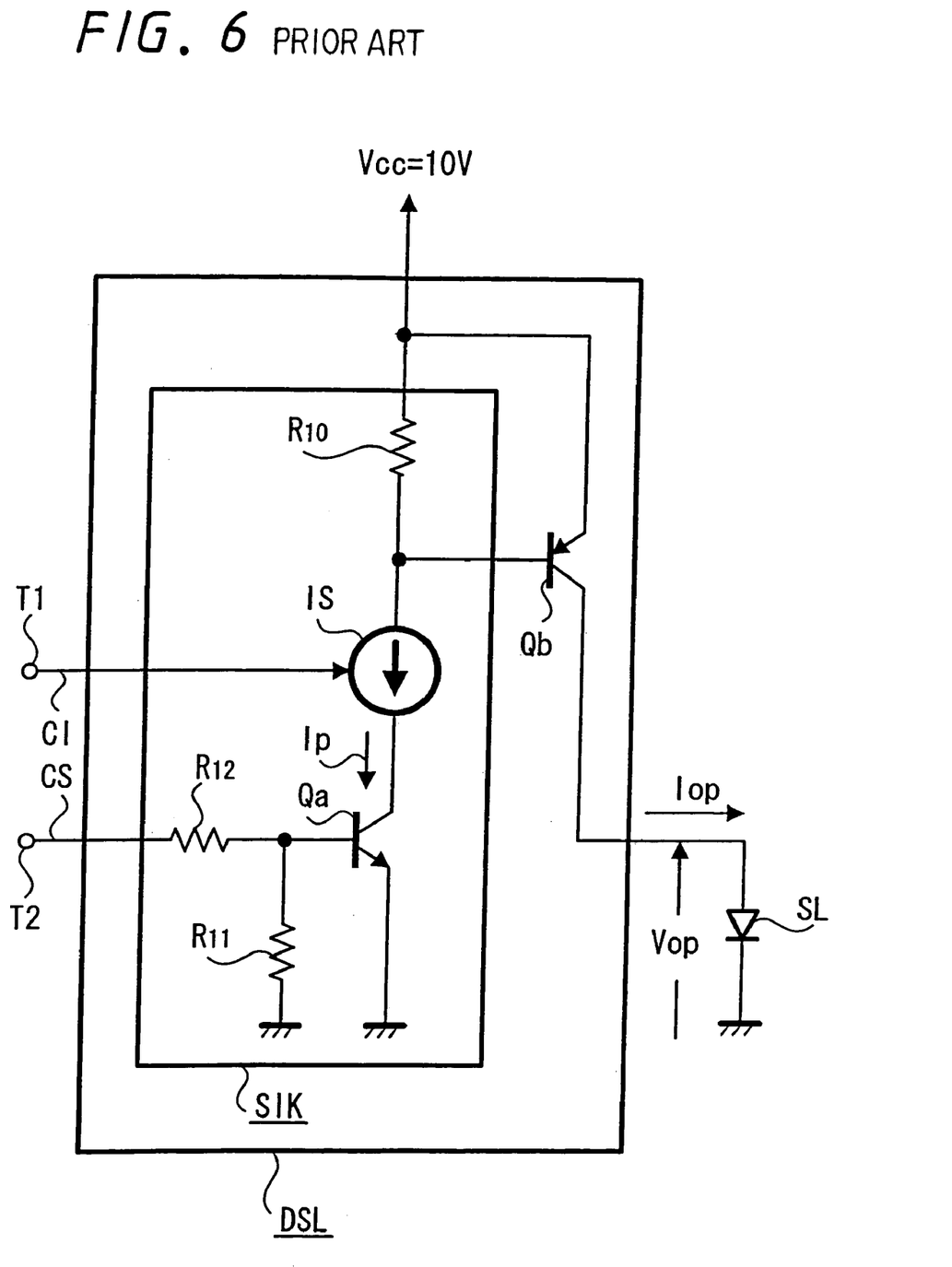
FIG. 6 is a circuit diagram illustrating a prior art example of a drive circuit for the semiconductor laser.

A conventional example of a semiconductor laser driving circuit will be explained with reference to FIG. 6. In FIG. 6, SL designates a high-output purple color semiconductor laser [GaN-based semiconductor laser (laser diode)] while DSL designates a drive circuit for driving the semiconductor laser SL. Hereinafter, a detailed explanation will now be given of the drive circuit for driving this semiconductor laser with reference to a timing chart of FIG. 7 as well. It is to be noted that the timing charts of FIG. 7 are illustrated considering a case where the semiconductor laser SL is used in an optical head as later described of the optical disk recording/reproducing apparatus (recording/reproducing method).

This drive circuit DSL is constructed of a switch-equipped current source circuit SIK and an output transistor Qb. The switch-equipped current source circuit SIK is constructed of a switch transistor (for example, an NPN type transistor) Qa, a current source IS, and resistors $R_{10}$, $R_{11}$ and $R_{12}$. The output transistor Qb is constructed of, for example, a PNP type transistor.

The emitter of the transistor Qa is grounded, and the base thereof is grounded via a base-biasing resistor $R_{11}$. The collector of the transistor Qa is connected to a power source of Vcc=10V via the current source IS and the resistor $R_{10}$. A point of connection between the current source IS and the resistor $R_{10}$ is connected to the base of the transistor Qb. The emitter of the transistor Qb is connected to the power source of Vcc=10V while the collector thereof is connected to the anode of the semiconductor laser (a laser diode) SL and the cathode thereof is grounded.

Figure 7A:
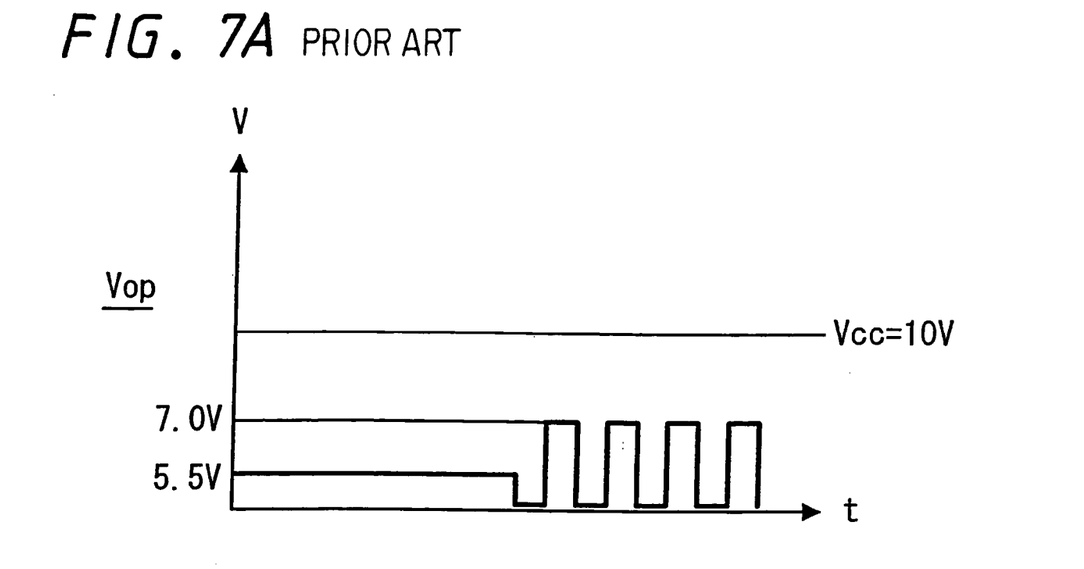
FIG. 7 is a timing chart of the prior art example of the drive circuit for the semiconductor laser.
Figure 7B:
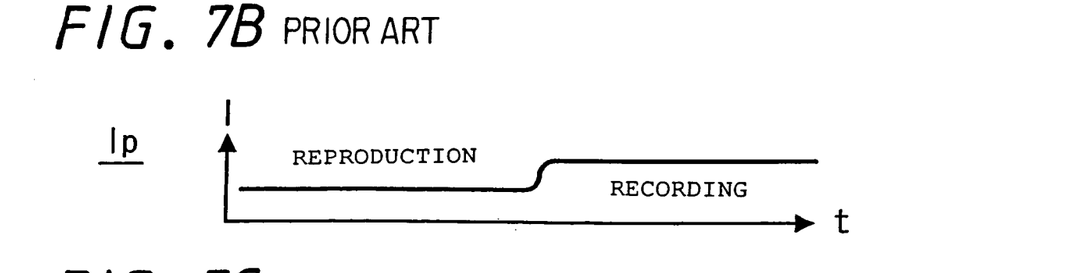
Figure 7C:
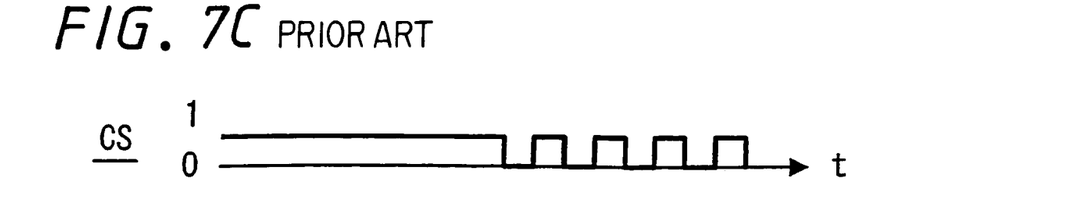

A control signal CS from an input terminal T2 is supplied to the base of the transistor Qa via the resistor $R_{12}$, whereby the transistor Qa is on/off controlled. As illustrated in FIG. 7C, this control signal CS, at the time of recording, changes alternately to "1" and "0" and, at the time of reproduction, is always kept to have a level of "1". Also, a peak current setting signal CI is supplied to the current source IS from an input terminal T1 and, as illustrated in FIG. 7B, a control is performed such that the peak current Ip at the time of recording becomes larger in amount than the peak current Ip at the time of reproduction. Further, a Vop in each of FIGS. 6 and 7A represents the operating voltage of the semiconductor SL. An Iop in FIG. 6 represents the operating current of the semiconductor laser SL.

The switching transistor Qa, at the time of reproduction, is always kept "on" and, at the time of recording, is turned on/off in correspondence with the recording timing (or in correspondence with the recording data). Accordingly, at the time of reproduction, the operating voltage Vop of the semiconductor laser SL has a constant voltage of, for example, 5.5 V while, at the time of recording, that operating voltage becomes a pulse voltage wherein a level of 7.0 V and a level of approximately 0V are alternately repeated. The operating current Iop of the semiconductor laser SL, at the time of reproduction, has a constant value of, for example, 50 mA, and, at the time of recording, has an average current value of, for example, 110 mA.

Incidentally, although there is a case where, at the time of reproduction, with an aim to decrease the noises, a small-amplitude sine wave signal of several hundreds of MHz is superimposed on the operating current Iop of the semiconductor laser SL, but since this has no direct relevancy to the operation of the semiconductor laser driving circuit DSL, the illustration is omitted.

Figure 8:
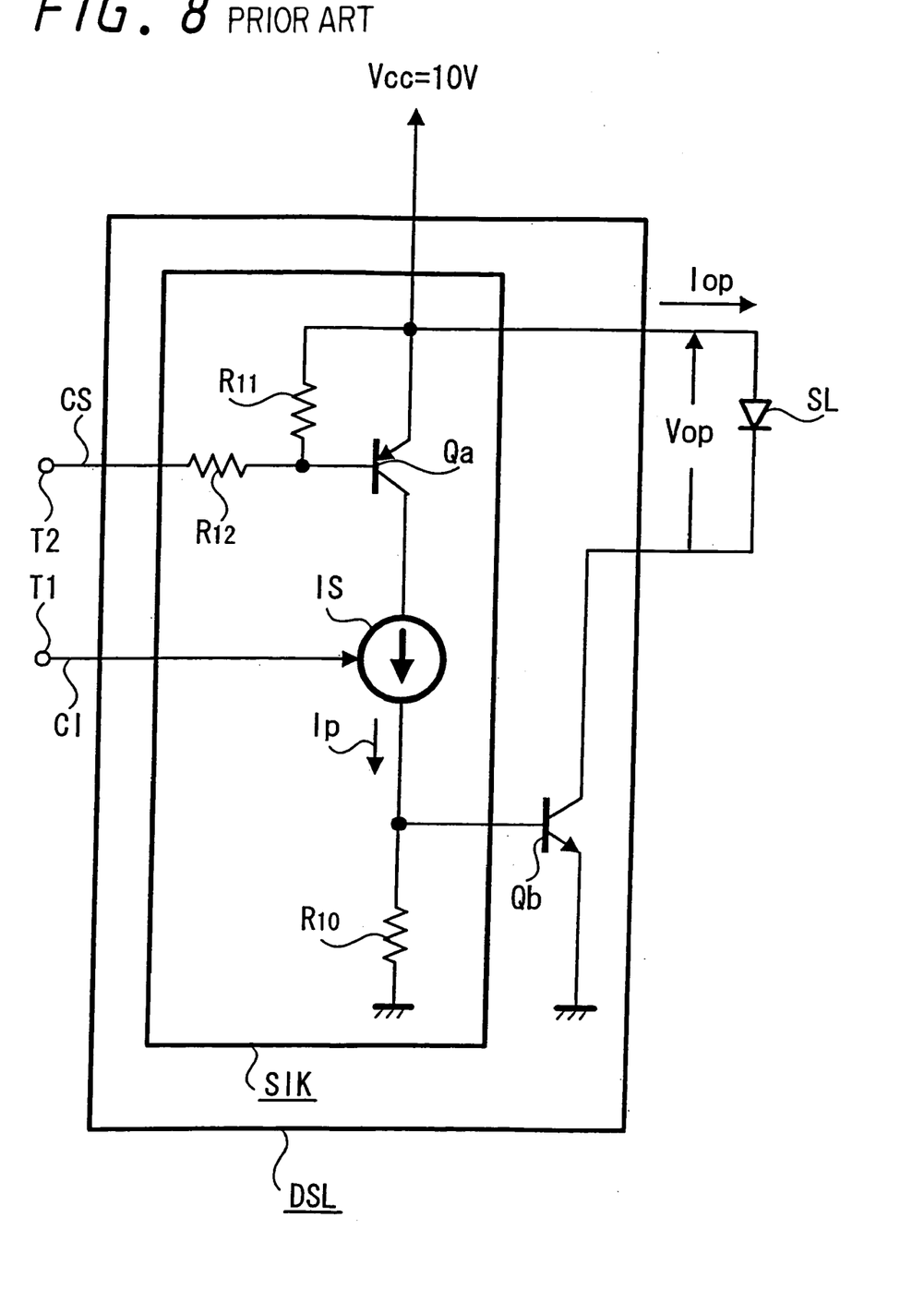
FIG. 8 is a circuit diagram illustrating another example of the prior art drive circuit for the semiconductor laser.

Although, in the semiconductor laser driving circuit DSL of FIG. 6, an NPN type transistor is used as the switching transistor Qa of the switch-equipped current source circuit SIK and a PNP type transistor is used as the output transistor Qb, as illustrated in FIG. 8, a PNP type transistor may be used as the switching transistor Qa and an NPN type transistor may be used as the output transistor Qb.

The semiconductor laser driving circuit in that case will now be explained with reference to FIG. 8. Incidentally, in FIG. 8, the relevant explanation will be made with the same reference symbols being used to designate the corresponding portions to those of FIG. 6. This drive circuit DSL is constructed of the switch-equipped current source circuit SIK and the output transistor Qb. The switch-equipped current source circuit SIK is constructed of the switching transistor (PNP type transistor) Qa, current source IS, and resistors $R_{10}$, $R_{11}$ and $R_{12}$. The output transistor Qb is constructed of an NPN type transistor.

The emitter of the transistor Qa is connected to the power source of Vcc=10V, and the base thereof is connected to the power source of Vcc=10V via the base-biasing resistor $R_{11}$. The collector of the transistor Qa is grounded via the current source IS and the resistor $R_{10}$. The connection point between the current source IS and the resistor $R_{10}$ is connected to the base of the transistor Qb. The emitter of the transistor Qb is grounded while the collector thereof is connected to the cathode of the semiconductor laser (a laser diode) SL and the anode thereof is connected to the power source of Vcc=10V.

From the input terminal T2 the control signal CS is supplied to the base of the transistor Qa via the resistor $R_{12}$, whereby the transistor Qa is on/off controlled. This control signal CS, at the time of recording, changes alternately to "1" and "0" and at the time of reproduction, is always kept to have a level of "0". Further, from the input terminal T1 the peak current setting signal CI is supplied to the current source IS and a control is performed such that the peak current Ip at the time of recording becomes larger in amount than the peak current Ip at the time of reproduction. The Vop represents the operating voltage of the semiconductor SL. The Iop represents the operating current of the semiconductor laser SL.

For example, the drive circuit for driving the semiconductor laser in FIG. 6 will be described below. The power consumption P of the output transistor Qb is expressed by the following equation (1).

$$P=(Vcc-Vop) \times Iop \qquad (1)$$

Calculating by substituting Vcc=V10V, Vop=5.5V (minimum value), and Iop=110 mA (maximum value) into the equation (1) above, the power consumption P of the output transistor Qb is expressed as done by the following equation (2).

$$P=(10-5.5)V \times 110\ mA=495\ mW \qquad (2)$$

For example, in case of a red color semiconductor laser, calculating by substituting Vcc=5V, Vop=1.8V (minimum value), and Iop=120 mA (maximum value) into the equation (1) above, the power consumption P of the output transistor Qb is expressed as done by the following equation (3).

$$P=(5-1.8)V \times 110 \text{ mA}=352 \text{ mA} \quad (3)$$

Namely, the power consumption P of the output transistor Qb is small compared with the high-output purple semiconductor laser.

As apparent from the foregoing, since the power consumption of the output transistor Qb in the case where the high-output purple semiconductor laser is used becomes fairly high compared with the power consumption of the output transistor Qb in the case where the red color semiconductor laser is used, it is necessary that a large-sized heat radiator should be attached to the output transistor Qb. However, since the drive circuit for the semiconductor laser is incorporated into the optical head (optical pick-up) jointly with the semiconductor laser, if providing a radiator on the output transistor Qb, the optical head (optical pick-up) inconveniently becomes large in size. However, if a large-sized radiator is not provided on the output transistor Qb, this output transistor Qb generates heat, which shortens the service life of the optical head (optical pick-up) and that of the semiconductor laser.

In view of the above-described points in problem, the present invention is intended to propose a laser power controlling method and apparatus for a semiconductor laser, the method and apparatus being arranged to control the laser power of a semiconductor laser by applying a power source voltage to a serial circuit of a path between the collector and emitter of the output transistor and a semiconductor laser, in which the power consumption of the output transistor can be decreased.

Also, the present invention is intended to propose a recording/reproducing method for a magneto-optical recording medium, in which a convergent laser light based on a laser light from a semiconductor laser is irradiated onto a magneto-optical recording medium to heat the same; a magnetic field based on recording information is applied to the heated portion of the magneto-optical recording medium to thereby record the information into the heated portion thereof; and a convergent laser light based on a laser light from the semiconductor laser is irradiated onto the magneto-optical recording medium having the information recorded therein to thereby reproduce the information by using the laser light emitted from the magneto-optical recording medium having the information recorded therein, whereby a power source voltage is applied to a serial circuit of a path between the collector and emitter of the output transistor and a semiconductor laser to thereby control the laser power of the semiconductor laser, the recording/reproducing method thereby enabling decreasing the power consumption of the output transistor.

Further, the present invention is intended to propose a recording/reproducing apparatus for a magneto-optical recording medium which includes an optical head that emits a convergent laser light based on a laser light from a semiconductor laser and magnetic field generator means that applies a magnetic field based on recording information to a magneto-optical recording medium; the convergent laser light from the optical head is irradiated onto the magneto-optical recording medium to heat the same and the magnetic field from the magnetic field generator means is applied to the heated portion of the magneto-optical recording medium to thereby record the information; and a convergent laser light from the optical head is irradiated onto the magneto-optical recording medium having the information recorded therein to thereby obtain from the optical head a reproduction information signal based on an emitted laser light from the magneto-optical recording medium having the information recorded therein, whereby a power source voltage is applied to a serial circuit of a portion between the collector and emitter of an output transistor and the semiconductor laser to thereby control the laser power of the semiconductor laser, thereby enabling decreasing the power consumption of the output transistor.

Further, the present invention is intended to propose a recording/reproducing method for an optical recording medium, in which a convergent laser light, based on a laser light from a semiconductor laser, which is optically modulated by information is irradiated onto an optical recording medium to thereby record the information; a convergent laser light based on a laser light from the semiconductor laser is irradiated onto the optical recording medium having the information recorded therein to thereby reproduce the information in accordance with an emitted laser light from the optical recording medium having the information recorded therein, whereby a power source voltage is applied to a serial circuit of a portion between the collector and emitter of an output transistor and the semiconductor laser to thereby control the laser power of the semiconductor laser, thereby enabling decreasing the power consumption of the output transistor.

Further, the present invention is intended to propose a recording/reproducing apparatus for an optical recording medium which includes an optical head that emits a convergent laser light, based on a laser light from a semiconductor laser, which is optically modulated by information and a convergent laser light which is not optically modulated by information, whereby, by irradiating onto an optical recording medium the convergent laser light of the laser light optically modulated by information from the optical head, the information is recorded and, by irradiating onto the information-recorded optical recording medium the convergent laser light which is not optically modulated by information from the optical head, a reproduction information signal based on the laser light from the information-recorded optical recording medium is obtained from the optical head, to thereby control the laser power of the semiconductor laser, thereby enabling decreasing the power consumption of the output transistor.

DISCLOSURE OF THE INVENTION

A first invention provides a laser power controlling method for a semiconductor laser, which is arranged to include a step of applying a variable power source voltage to a serial circuit of an output transistor and a semiconductor laser; and a step of controlling the variable power source voltage such that a difference between the variable power source voltage and the peak hold voltage of an operating voltage of the semiconductor laser becomes substantially constant.

A second invention provides a laser power controlling device for a semiconductor laser, which includes a serial circuit of an output transistor and a semiconductor laser; a variable power source device that applies a variable power source voltage to the serial circuit; a peak hold circuit that obtains the peak hold voltage of an operating voltage of the semiconductor laser; and control means that controls the variable power source device such that a difference voltage between the variable power source voltage and the peak hold voltage becomes a substantially constant voltage.

A third invention provides a recording/reproducing method for a magneto-optical recording medium, in which a convergent laser light based on a laser light from a semiconductor laser is irradiated onto a magneto-optical recording medium to heat the same; a magnetic field based on recording information is applied to the heated portion of the magneto-optical recording medium to thereby record the recording information into the heated portion thereof; and a convergent laser light based on a laser light from the semiconductor laser is irradiated onto the magneto-optical recording medium having the information recorded therein to thereby reproduce the information by using the laser light emitted from the magneto-optical recording medium having the information recorded therein, whereby a variable power source voltage is applied to a serial circuit of an output transistor and a semiconductor laser; and the variable power source voltage is controlled such that a difference voltage between the variable power source voltage and the peak hold voltage becomes a substantially constant voltage.

A fourth invention provides a recording/reproducing apparatus for a magneto-optical recording medium which includes an optical head that emits a convergent laser light based on a laser light from a semiconductor laser and magnetic field generator means that applies a magnetic field based on recording information to a magneto-optical recording medium, whereby the convergent laser light from the optical head is irradiated onto the magneto-optical recording medium to heat the same and the magnetic field from the magnetic field generator means is applied to the heated portion of the magneto-optical recording medium to thereby record the information; and a convergent laser light from the optical head is irradiated onto the magneto-optical recording medium having the information recorded therein to thereby obtain from the optical head a reproduction information signal based on an emitted laser light from the magneto-optical recording medium having the information recorded therein, whereby the apparatus includes a serial circuit of an output transistor and a semiconductor laser; a variable power source device that applies a variable power source voltage to the serial circuit; a peak hold circuit that obtains the peak hold voltage of an operating voltage of the semiconductor laser; and control means that controls the variable power source device such that a difference voltage between the variable power source voltage and the peak hold voltage becomes a substantially constant voltage.

A fifth invention provides a recording/reproducing method for an optical recording medium, in which a convergent laser light, based on a laser light from a semiconductor laser, which is optically modulated by information is irradiated onto an optical recording medium to thereby record the information; and a convergent laser light based on a laser light from the semiconductor laser is irradiated onto the optical recording medium having the information recorded therein to thereby reproduce the information in accordance with an emitted laser light from the optical recording medium having the information recorded therein, whereby a variable power source voltage is applied to a serial circuit of an output transistor and a semiconductor laser; and the variable power source voltage is controlled such that a difference voltage between the variable power source voltage and the peak hold voltage becomes a substantially constant voltage.

A sixth invention provides a recording/reproducing apparatus for an optical recording medium which includes an optical head that emits a convergent laser light, based on a laser light from a semiconductor laser, which is optically modulated by information and a convergent laser light which is not optically modulated by information, whereby, by irradiating onto an optical recording medium the convergent laser light of the laser light optically modulated by information from the optical head, the information is recorded and, by irradiating onto the information-recorded optical recording medium the convergent laser light which is not optically modulated by information from the optical head, a reproduction information signal based on the laser light emitted from the information-recorded optical recording medium is obtained by the optical head, whereby the apparatus includes a serial circuit of an output transistor and a semiconductor laser; a variable power source device that applies a variable power source voltage to the serial circuit; a peak hold circuit that obtains the peak hold voltage of an operating voltage of the semiconductor laser; and control means that controls the variable power source device such that a difference voltage between the variable power source voltage and the peak hold voltage becomes a substantially constant voltage.

BEST MODE FOR CARRYING OUT THE INVENTION

Figure 1:
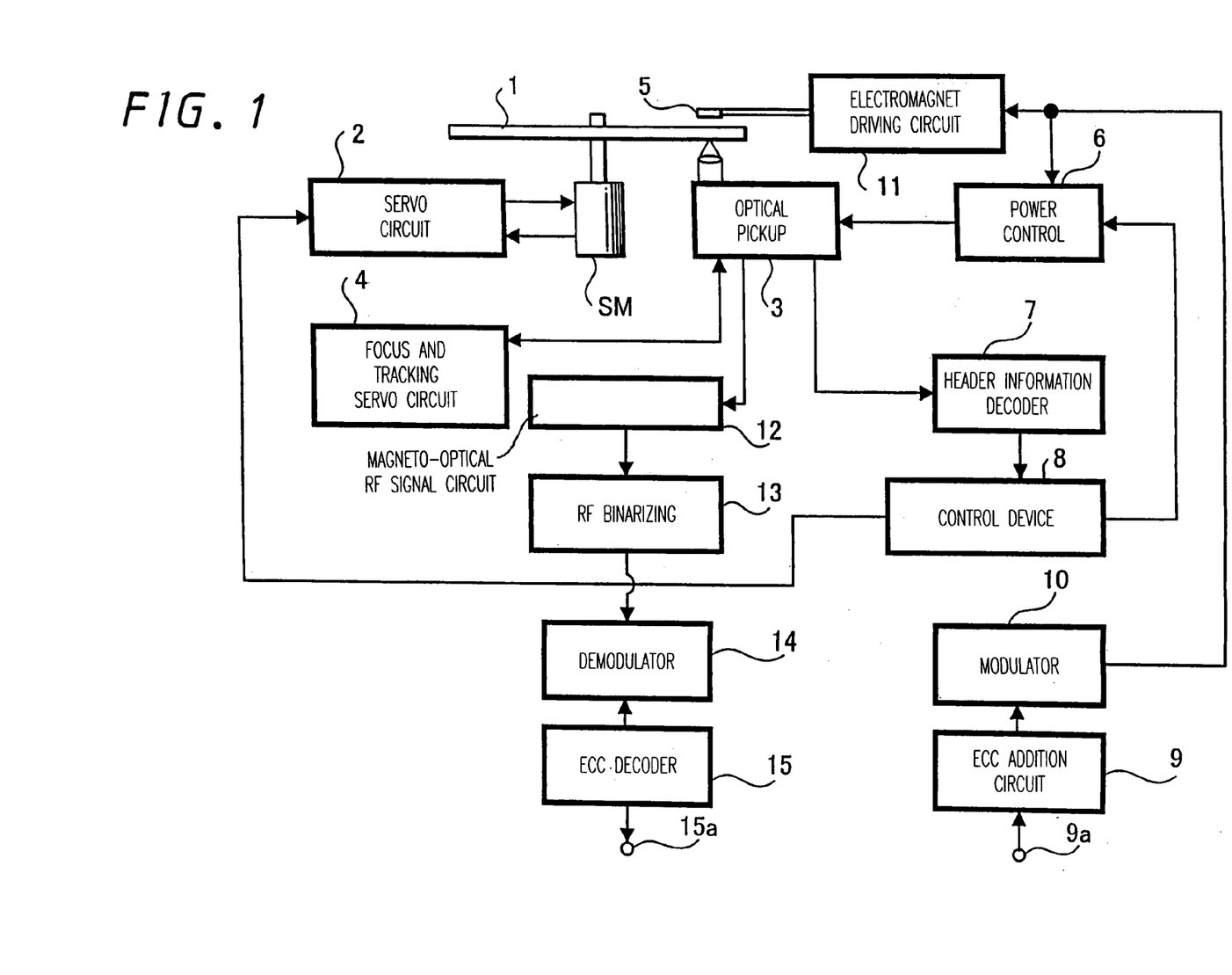
FIG. 1 is a block diagram illustrating a recording/reproducing apparatus for a magneto-optical disc according to an embodiment of the present invention.

Next, an example of a recording/reproducing apparatus (recording apparatus and reproducing apparatus) for a magneto-optical disc according to an embodiment of the present invention, that has a laser power control circuit for a semiconductor laser as later described will be explained with reference to FIG. 1. In FIG. 1, a reference numeral 1 denotes an magneto-optical disc, which is driven to rotate by a spindle motor SM via a spindle. The spindle motor SM is servo controlled by a spindle motor servo circuit 2. This servo circuit 2 is controlled by a control device (having a microcomputer built therein).

A reference numeral 3 denotes an optical head (optical pick-up) in which there is built in a semiconductor laser, the laser light from which enters an objective lens via an optical system, and a convergent laser light emitted therefrom is irradiated onto the recording surface of the magneto-optical disc 1. The optical head 3 is controlled by a focus and tracking servo circuit 4. The power of the laser light from the semiconductor laser is controlled by a laser power control circuit 6 according to a recording/reproducing laser power setting control signal from the control device 8.

A reference numeral 5 denotes an electromagnet, which is disposed on a side that is opposite, with respect to the magneto-optical disc 1, to the side where the objective lens is located, and which is driven by an electromagnet driving circuit 11. At the time of recording, the recording surface of the magneto-optical disc 1 is heated by the convergent laser light up to the Curie point or more. Thereafter, to the portion whose temperature has decreased there is applied by the electromagnet 5 a magnetic field whose polarities correspond to "1" and "0" of the recording data, whereby the recording data is recorded onto the recording surface of the magneto-optical disc 1. The recording data from an input terminal 9a is supplied to an ECC addition circuit 9, whereby the ECC (Error Correction Code) is added to the recording data. Thereafter, this recording data is supplied to a modulator circuit 10 where it is digital-modulated. And this modulated recording data is supplied to the electromagnet driving circuit 11. Also, this modulated recording data from the modulator circuit 10 is supplied to the laser power control circuit 6 as well.

When reproducing from the optical head 3, a weak laser light for reproduction is irradiated onto the recording surface of the magneto-optical disc 1. The reflected light returns to the optical head 3, whereby a MO(magneto-optical) RF(radio frequency) signal and a PIT (pit) (high intensity light) RF signal are outputted. The MO RF signal is supplied to an RF binarizing circuit 13, thereby a binary signal is obtained. This binary signal is supplied to a digital demodulator circuit 14 and is thereby demodulated. This demodulated digital signal is supplied to an ECC decoder circuit 15, thereby error correction processing is executed. This error-corrected reproduction data is output to an output terminal 15a. The PIT RF signal from the optical head 3 is supplied to a header information decoder circuit 7 and is thereby decoded. And the header information data thus obtained is supplied to the control device 8.

In the recording/reproducing apparatus of FIG. 1, when a phase change type optical disc or an optical disc using a pigment is adopted in place of the magneto-optical disc 1, the apparatus may be constructed in the way of omitting the electromagnet 5 and electromagnet driving circuit 11, supplying the modulated recording data from the modulator circuit 10 directly to the laser power control circuit 6, and making the operating voltage of the semiconductor laser on or off in correspondence with that recording data.

Hereinafter an example of the laser power control apparatus for the semiconductor laser according to the embodiment of the present invention will be explained in detail with reference to FIG. 2. It is to be noted that, in FIG. 2, the portions corresponding to those in FIG. 6 are denoted by the same reference symbols. A symbol DSL denotes a drive circuit for a semiconductor laser, which is constructed of a switch-equipped current source circuit SIK and an output transistor Qb which are the same circuit construction as that explained in connection with FIG. 6. And, as in FIG. 6, the collector of the output transistor Qb is connected to the anode of a semiconductor laser SL built in the optical head 3 in FIG. 1, the cathode of which is grounded. Here, although the semiconductor laser SL is a GaN-based high output purple color semiconductor laser (a high output purple color laser diode), the invention is not limited thereto.

A symbol PS denotes a DC—DC converter serving as a variable power source device whose output power source voltage can be varied. The power source device PS is grounded and, in addition, its variable power source voltage Vcc is applied to a serial circuit of the output transistor Qb and the semiconductor laser SL and is also applied to the switch-equipped current source circuit SIK.

The operating voltage Vop of the semiconductor laser SL is applied to a peak hold circuit PH and is peak-held. This peak hold circuit PH is constructed of an NPN type transistor Qc functioning as a diode and a hold capacitor C1. To the collector of the transistor Qc there is applied the variable power source voltage Vcc from the power source device PS. The base of the transistor Qc is connected to the collector of the output transistor Qb. The emitter of the transistor Qc is grounded via the hold capacitor C1.

By peak-holding the operating voltage Vop using this peak hold circuit PH, when the semiconductor laser SL has generated a pulse light, since the power source voltage Vcc instantly responds to the operating voltage Vop, the switch-equipped current source circuit SIK can flow a necessary current to the output transistor Qb.

The variable power source voltage Vcc of the power source device PS and the peak-hold voltage (referred to as "Vh") of the peak hold circuit PH have their voltages divided by a resistance voltage divider of a serial circuit of resistors R1 and R2 and by a resistance voltage divider of a serial circuit of resistors R3 and R4, respectively, in the same ratio. The respective divided voltage outputs are supplied, respectively, to their corresponding A/D converters "b" and "c" of a microcomputer MC. Representing the resistance values of the resistors R1 to R4 by the same symbols R1 to R4, the following relationship of equation (4) holds true among those resistance values.

$$R1/(R1+R2)=R3/(R3+R4) \quad (4)$$

Rewriting this equation (4) for rearrangement, the following equation (5) results.

$$R1/R2=R3/R4 \quad (5)$$

The microcomputer MC includes, other than the above-described A/D converters "b" and "c", a CPU "a", a ROM "d" and RAM "e" respectively connected to the CPU "a", and a D/A converter "f" for performing D/A conversion on a digital control signal from the CPU "a".

This microcomputer MC operates in accordance with the program stored in the ROM "d". Namely, as illustrated in FIG. 3, it outputs from the D/A converter "f" an analog control signal (this may be an instruction signal, a PWM signal, etc.) permitting the difference voltage (Vcc−Vh) between the variable power source voltage Vcc of the power source device PS and the peak hold voltage Vh of the peak hold circuit PH to become a constant (substantially constant) voltage Vconst. It then supplies that analog signal to the power source device PS to thereby control the variable power source voltage Vcc of the power source device PS. Incidentally, in FIG. 3, the symbol Vop represents the operating voltage of the semiconductor laser SL. This operating voltage Vop is the same as that explained in connection with FIG. 7A when the semiconductor laser SL is a high output purple color semiconductor laser.

Regarding FIG. 2, a further explanation will be given. When recording, a control signal CS from an input terminal T3 is supplied to a D input terminal of a D type flip-flop circuit D-FF. This control signal, as stated in conjunction with FIG. 7C, alternately changes to "1" and "0" in correspondence with the recording timing or recording data at the time of recording and, when reproducing, is always kept to have a level of "1". A clock CLK, from an input terminal T4, for driving the semiconductor laser is supplied to a clock inversion input terminal of the type flip-flop circuit D-FF.

And a non-inverted output (pulse) of the D type flip-flop circuit D-FF is supplied, via the input terminal T2, to the base of a switching transistor of the switch-equipped current source circuit SIK.

When reproducing, a control signal CS at all times kept "1" is supplied, via the D type flip-flop circuit D-FF and via the input terminal T2, to the base of the switching transistor of the switch-equipped current source circuit SIK. Also, the clock CLK from the input terminal T4 is supplied to a frequency divider FD and is frequency-divided with a pre-scribed frequency dividing ratio N (N is an integer two or more). This frequency-divided clock clk is supplied to the micro-computer MC and the power source device PS. As a result of the dividing operation, it is possible to more prevent the micro-computer MC, the digital calculator circuit within this micro-computer MC, and the clock CLK of the analog control signal (the instruction signal, PWM signal, etc.) of the micro-computer MC, from having their adverse effect upon the semiconductor laser SL, and resultantly to decrease the entry of the clock CLK into the waveform of the light signal emitted from the semiconductor laser SL.

Figure 2:
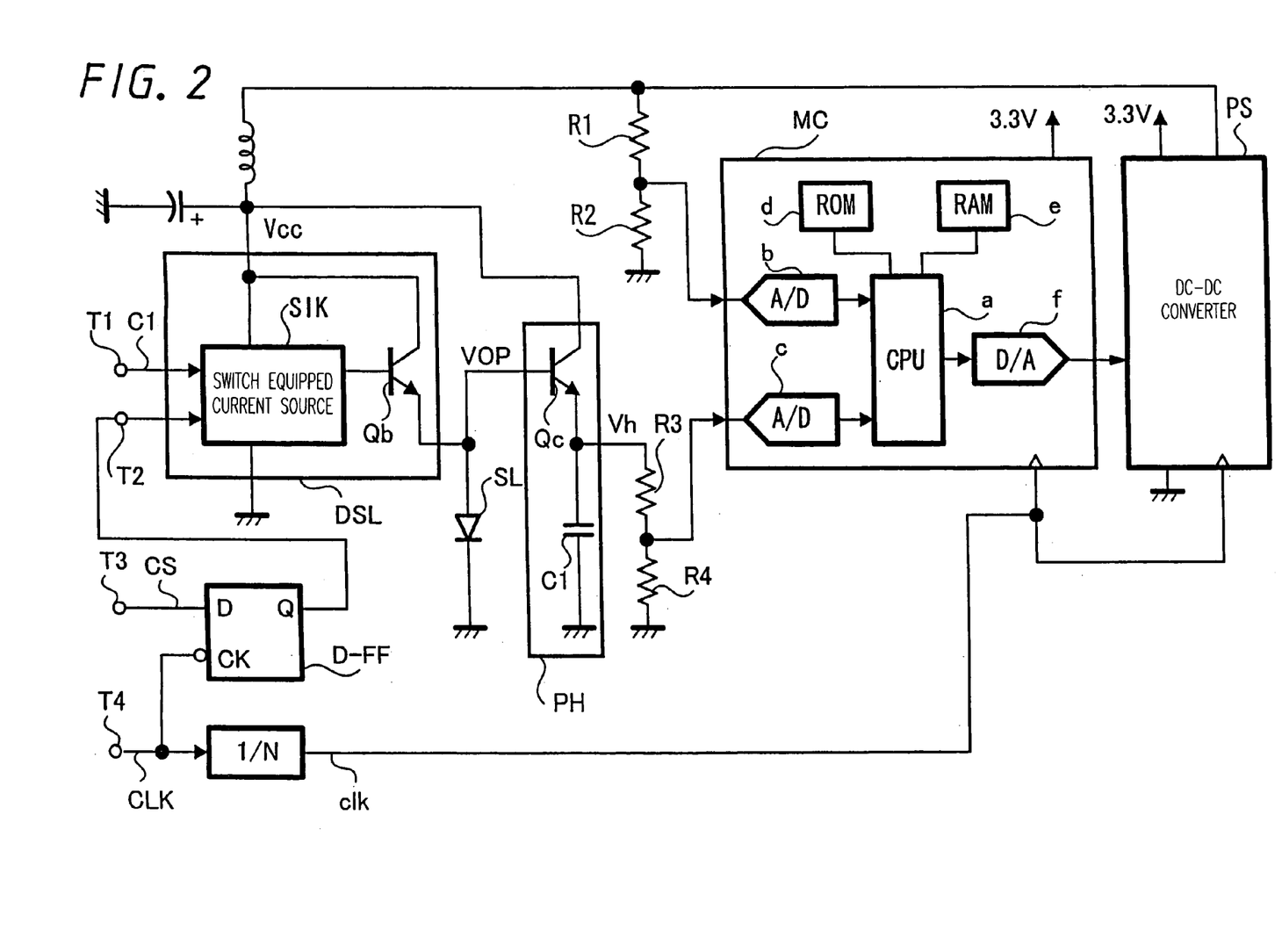
FIG. 2 is a circuit diagram illustrating an example of a laser power control circuit for a semiconductor laser according to the embodiment of the present invention.
Figure 3:
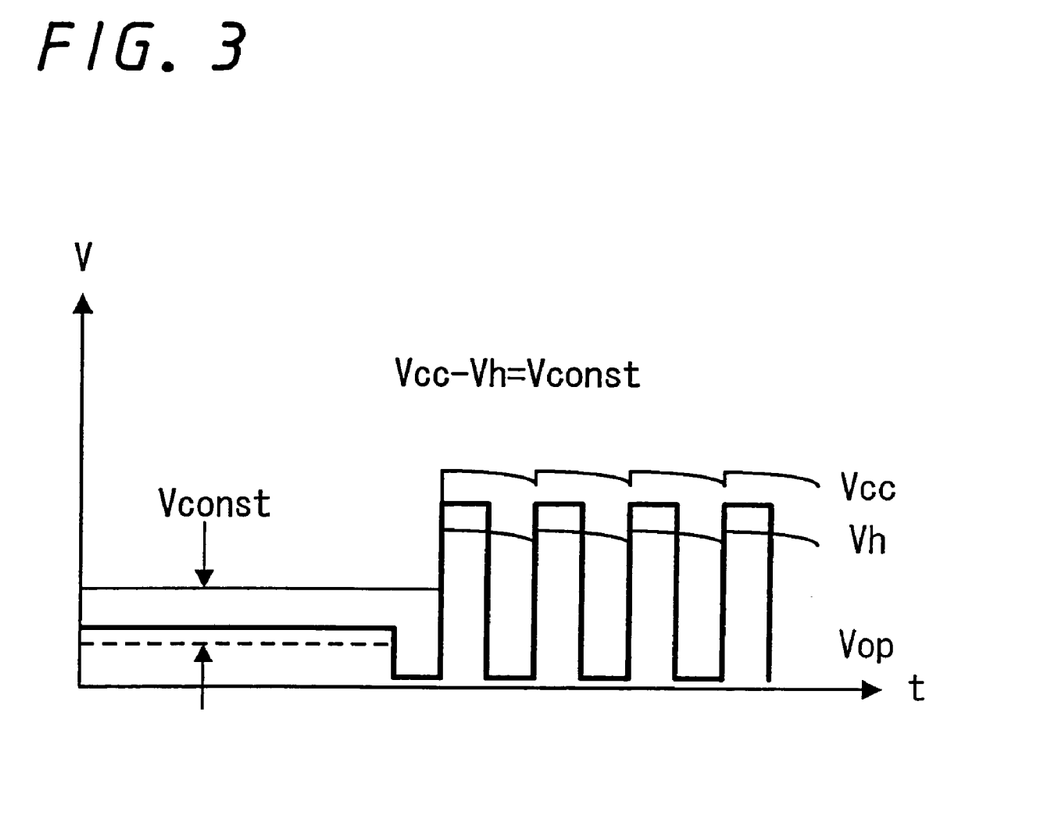
FIG. 3 is a diagram illustrating the voltages and waveforms at respective portions in the laser power control circuit for the semiconductor laser according to the embodiment of the present invention.

Hereinafter, with reference to FIG. 4, another example of the laser power control device for the semiconductor laser according to the embodiment of the present invention will be explained in detail, provided, however, that in FIG. 4 the portions corresponding to those in FIGS. 2 and 3 are denoted by the same reference symbols; and a relevant partial explanation will be omitted. In this example, in place of the micro-computer MC of FIG. 2, a subtractor circuit SUB is used and, in place of the power source device PS from which a variable voltage is obtained, there is used a power source device PS1 constructed of a boosting type DC—DC converter.

The subtractor circuit SUB is equipped with operational amplifiers OP1 to OP3. The divided voltage from the resistance voltage divider circuit of resistors R1 and R2 is supplied to a non-inversion input terminal of the operational amplifier OP1 whose output terminal is connected to an inversion input terminal. And, the output voltage from the operational amplifier OP1 is supplied, via a resistor R5, to a non-inversion input terminal of the operational amplifier OP3, the output terminal and inversion input terminal of which are connected to each other through a resistor R8. The divided voltage from a resistance voltage divider circuit of resistors R3 and R4 is supplied to a non-inversion input terminal of the operational amplifier OP2 whose output terminal is connected to its inversion input terminal. And, the output voltage of the operational amplifier OP2 is supplied, via a resistor R7, to the inversion input terminal of the operational amplifier OP3. Incidentally, when the resistance values of the resistors R1 to R8 are represented by the symbols R1 to R8, these resistance values R1 to R8 are selected so as to satisfy the following relationship of equation (6).

$$R1/R2=R3/R4, R5/R6=R7/R8 \quad (6)$$

A power source device PS1 of the boosting type DC—DC converter is constructed of a comparator "g" for comparing the output voltage from the operational amplifier OP3 of the subtractor circuit SUB with a reference voltage of a reference voltage source "h", NOR gates "i" and "j", p-type MOS-FET "k", and diode (m). The comparison output of the level comparator "g" is input to the NOR gate "j"; the clock clk from the frequency divider FD is input to the NOR gate "i"; the output of one NOR gate "i" is input to the other NOR gate "j" while the output of the other NOR gate "j" is input to the one NOR gate "i"; and the output of the one NOR gate "i" is input to the gate of the pMOS-FET "k". The source of the MOS-FET "k" is grounded and the drain thereof is connected to the anode of the diode "m", the variable power source voltage Vcc from the cathode of which is applied to a serial circuit of the output transistor Qb and the semiconductor laser SL and also applied to the switch-equipped current source circuit SIK.

And, as illustrated in FIG. 3, the subtractor output voltage from the subtractor circuit SUB, which permits the difference voltage between the variable power source voltage Vcc of the power source device PS1 and the peak hold voltage Vh of the peak hold circuit to become constant (substantially constant), is supplied to the level comparator "g" of the power source device PS1 to thereby control the variable power source voltage Vcc of the power source device PS1.

Figure 4:
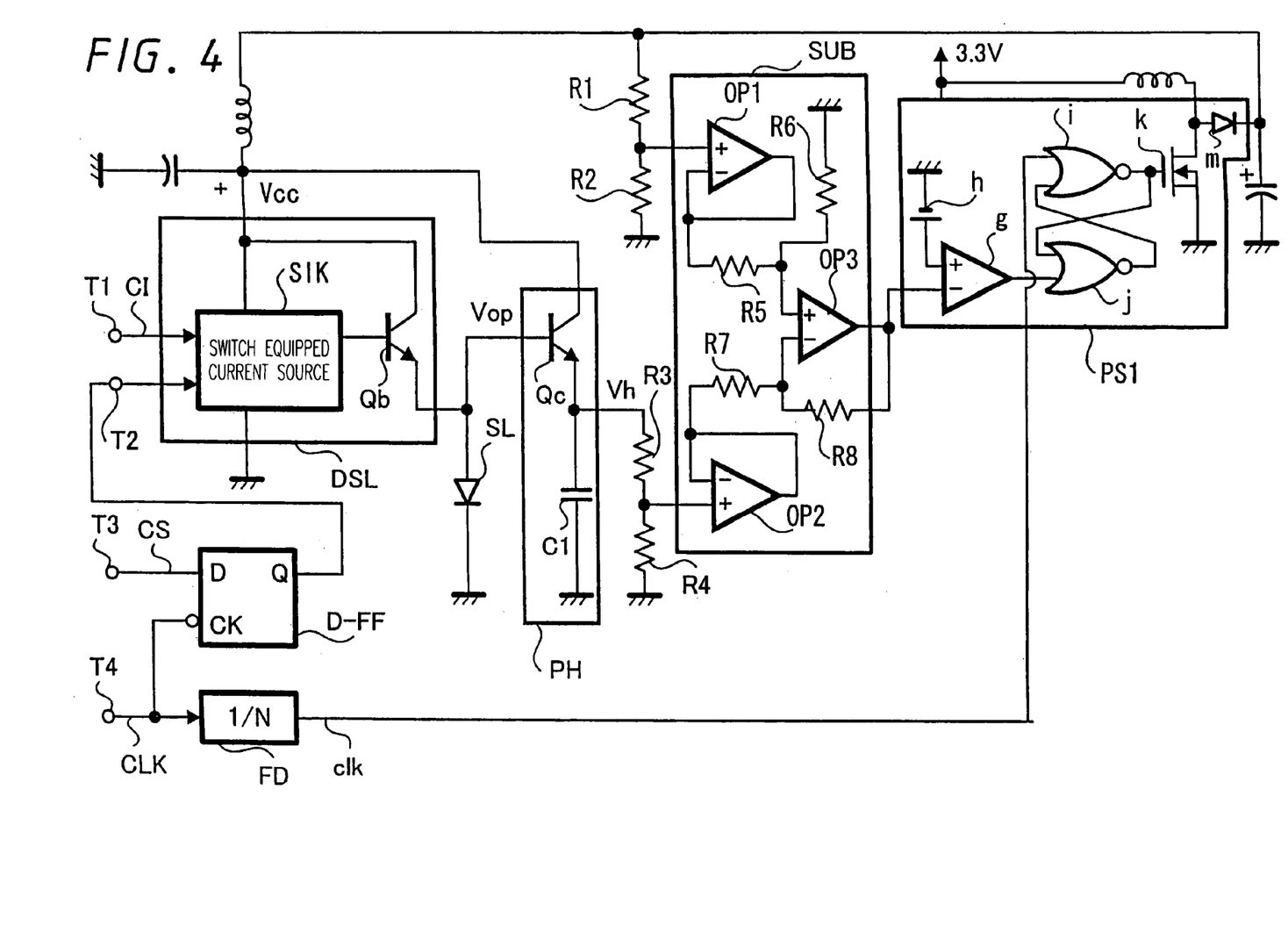
FIG. 4 is a circuit diagram illustrating another example of the laser power control circuit for the semiconductor laser according to the embodiment of the present invention.

Incidentally, in this example of FIG. 4, by inputting the clock clk from the frequency divider FD to the NOR gate of the power source device PS1, it is possible to decrease the entry or superimposing of the clock CLK from the power source device PS1 into the wave form of the light signal from the semiconductor laser SL.

Hereinafter, with reference to FIG. 5, still another example of the laser power control device for the semiconductor laser according to the embodiment of the present invention will be explained in detail, provided, however, that in FIG. 5 the portions corresponding to those in FIGS. 2, 3, and 4 are denoted by the same reference symbols; and a relevant partial complex explanation will be omitted. In this example, in place of the power source device PS1 comprised of the boosting type DC—DC converter of FIG. 4, there is used a power source device PS2 constructed of a series regulator.

The output voltage from the operational amplifier OP3 of the subtractor circuit SUB similar to that in the example of FIG. 4 is supplied to the comparator "g" for comparing this output voltage with the reference voltage of the reference voltage source "h" of the power source device PS2. This power source device PS2 is equipped, in addition to the reference voltage source "h" and comparator "g", with, for example, an NPN type transistor "n", whereby the comparison output of the comparator "g" is supplied to the base of the transistor "n". And, to the collector of the transistor "n", there is applied a fixed level of direct current voltage (reference voltage) (for example, +10V) from the direct current power source DS. And, by the comparison output from the level comparator "g", the impedance between the collector and emitter of the transistor "n" is controlled. Namely, the subtractor output from the subtractor circuit SUB, which permits the difference voltage (Vcc–Vh) between the variable power source voltage Vcc of the power source device PS2 and the peak hold voltage Vh of the peak hold circuit PH to become a constant (substantially constant) voltage Vconst, is supplied to the power source device PS2 to thereby control the variable power source voltage Vcc of the power source device PS2.

Figure 5:
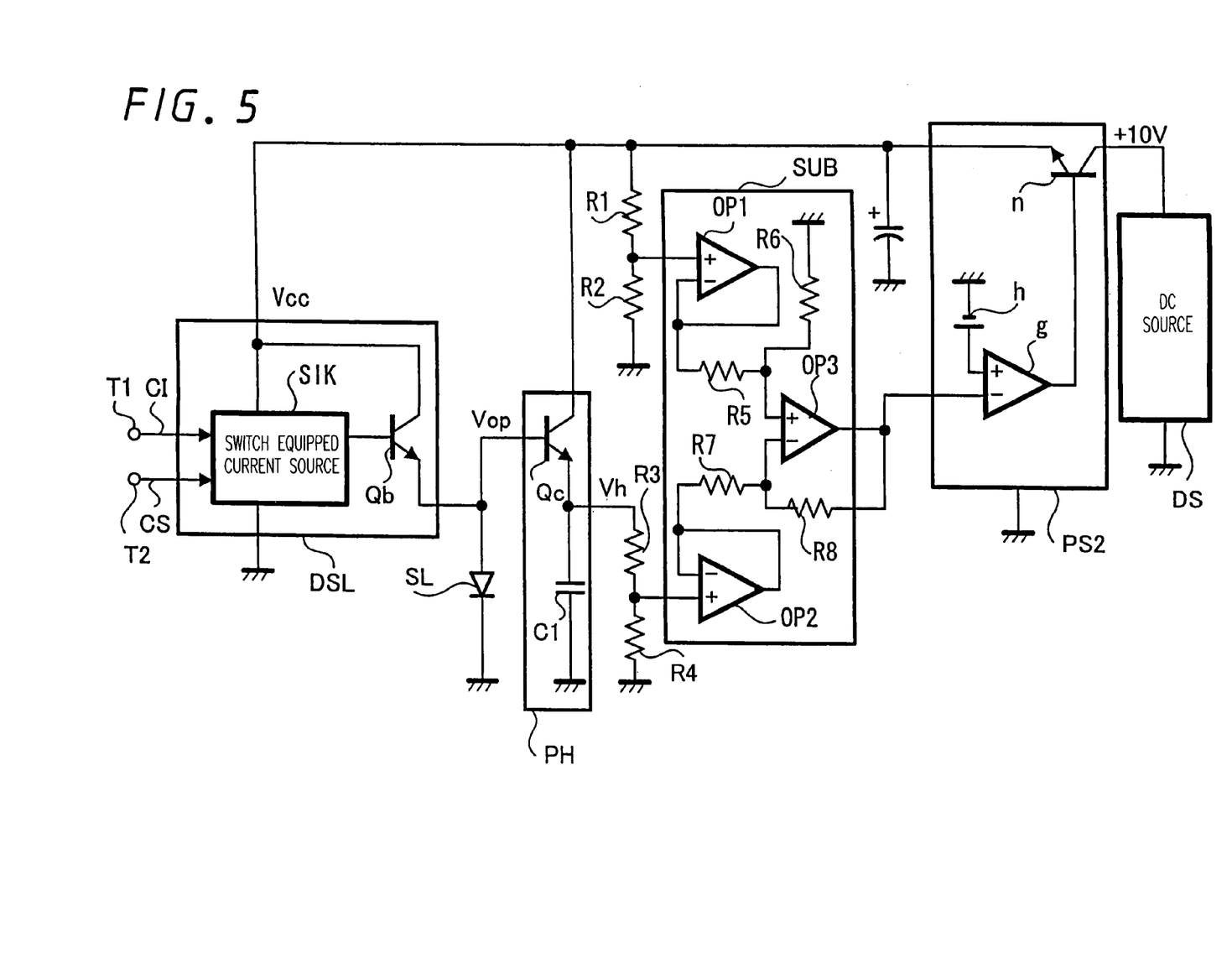
FIG. 5 is a circuit diagram illustrating further example of the laser power control circuit for the semiconductor laser according to the embodiment of the present invention.

In case of FIG. 5, the control signal CS from the input terminal T2 is supplied directly to the switch-equipped current circuit SIK.

In this example of the laser power control circuit for the semiconductor laser in FIG. 5, the power consumption is shared by the output transistor Qb and the transistor "n" of the power source device PS2.

According to the first invention, since it has been arranged to apply a variable power source voltage to a serial circuit of an output transistor and a semiconductor laser and to control the variable power source voltage such that a difference between the variable power source voltage and the peak hold voltage of an operating voltage of the semiconductor laser becomes substantially constant, it is possible to obtain a laser power controlling method for a semiconductor laser that enables decreasing the power consumption of the output transistor.

According to the second invention, since it has a serial circuit of an output transistor and a semiconductor laser, a variable power source device that applies a variable power source voltage to the serial circuit, a peak hold circuit that obtains the peak hold voltage of an operating voltage of the semiconductor laser, and control means that controls the variable power source device such that a difference voltage between the variable power source voltage and the peak hold voltage become a substantially constant voltage, it is possible to obtain a device for controlling the laser power of the semiconductor laser that enables decreasing the power consumption of the output transistor.

According to the third invention, since it has been arranged, in a recording/reproducing method for a magneto-optical recording medium wherein a convergent laser light based on a laser light from a semiconductor laser is irradiated onto a magneto-optical recording medium to heat the same; a magnetic field based on recording information is applied to the heated portion of the magneto-optical recording medium to thereby record the recording information into the heated portion thereof; and a convergent laser light based on a laser light from the semiconductor laser is irradiated onto the magneto-optical recording medium having the information recorded therein to thereby reproduce the information by using the laser light emitted from the magneto-optical recording medium having the information recorded therein, such that a variable power source voltage be applied to a serial circuit of an output transistor and a semiconductor laser; and the variable power source voltage be controlled such that a difference voltage between the variable power source voltage and the peak hold voltage become a substantially constant voltage, therefore it is possible to obtain a recording/reproducing method for a magneto-optical recording medium that enables decreasing the power consumption of the output transistor.

According to the fourth invention, since it has been arranged, in a recording/reproducing apparatus for a magneto-optical recording medium which includes an optical head that emits a convergent laser light based on a laser light from a semiconductor laser and magnetic field generator means that applies a magnetic field based on recording information to a magneto-optical recording medium, whereby the convergent laser light from the optical head is radiated onto the magneto-optical recording medium to heat the same and the magnetic field from the magnetic field generator means is applied to the heated portion of the magneto-optical recording medium to thereby record the information; and a convergent laser light from the optical head is radiated onto the magneto-optical recording medium having the information recorded therein to thereby obtain from the optical head a reproduction information signal based on an emitted laser light from the magneto-optical recording medium having the information recorded therein, such that the apparatus includes a serial circuit of an output transistor and a semiconductor laser; a variable power source device that applies a variable power source voltage to the serial circuit; a peak hold circuit that obtains the peak hold voltage of an operating voltage of the semiconductor laser; and control means that controls the variable power source device such that a difference voltage between the variable power source voltage and the peak hold voltage become a substantially constant voltage, therefore it is possible to obtain a recording/reproducing apparatus for a magneto-optical recording medium that enables decreasing the power consumption of the output transistor.

According to the fifth invention, since it has been arranged, in a recording/reproducing method for an optical recording medium in which a convergent laser light, based on a laser light from a semiconductor laser, which is optically modulated by information is irradiated onto an optical recording medium to thereby record the information; and a convergent laser light based on a laser light from the semiconductor laser is irradiated onto the optical recording medium having the information recorded therein to thereby reproduce the information in accordance with an emitted laser light from the optical recording medium having the information recorded therein, such that a variable power source voltage be applied to a serial circuit of an output transistor and a semiconductor laser; and the variable power source voltage be controlled such that a difference between the variable power source voltage and the peak hold voltage become a substantially constant voltage, therefore it is possible to obtain a recording/reproducing method for an optical recording medium that enables decreasing the power consumption of the output transistor.

According to the sixth invention, since it has been arranged, in a recording/reproducing apparatus for an optical recording medium which includes an optical head that emits a convergent laser light, based on a laser light from a semiconductor laser, which is optically modulated by information and a convergent laser light which is not optically modulated by information, whereby, by irradiating onto an optical recording medium the convergent laser light of the laser light optically modulated by the information from the optical head, the information is recorded and, by irradiating onto the information-recorded optical recording medium the convergent laser light which is not optically modulated by information from the optical head, a reproduction information signal based on the laser light emitted from the information-recorded optical recording medium is obtained from the optical head, such that the apparatus includes a serial circuit of an output transistor and a semiconductor laser; a variable power source device that applies a variable power source voltage to the serial circuit; a peak hold circuit that obtains the peak hold voltage of an operating voltage of the semiconductor laser; and control means that controls the variable power source device such that a difference voltage between the variable power source voltage and the peak hold voltage become a substantially constant voltage, therefore it is possible to obtain a recording/reproducing apparatus for an optical recording medium that enables decreasing the power consumption of the output transistor.

According to the first to the sixth inventions, since it is possible to decrease the power consumption of the output transistor, a radiator for the output transistor becomes unnecessary. Even when such radiator is necessary, it is sufficient to use a small-sized one.

According to the first to the sixth inventions, since it is possible to decrease the power consumption of the output transistor and therefore since the rise in the temperature of the semiconductor laser and the laser power control circuit disposed near that semiconductor laser can be decreased, it is possible to prevent the defective operation and the decrease in the service life of the semiconductor laser, the optical head, and the laser power control circuit. Further, considering about the limitation of the temperature rise of the apparatus having these operational members loaded therein, miniaturization of the apparatus becomes possible even if the size thereof must be selected greater than a predetermined size.

In general, while the operational voltage of the semiconductor laser increases during its aged operation and the operational voltage comes near to the power source voltage for the output transistor of the laser power control circuit for the semiconductor laser and this leads to the end of the service life, according to the first to the sixth inventions it is possible to make that power source voltage higher than that in the prior art, which enables extending the life of the semiconductor laser.

In the first to the sixth inventions, the effect of decreasing the power consumption of the output transistor becomes remarkable when the semiconductor laser is a high output purple color semiconductor laser.

The invention claimed is:

1. A laser power controlling method for a semiconductor laser, comprising the steps of:
   applying a variable power source voltage to a serial circuit of an output transistor and a semiconductor laser;
   obtaining a peak hold voltage of an operating voltage of the semiconductor laser; and
   controlling the variable power source voltage such that a difference between the variable power source voltage and the peak hold voltage of the operating voltage of the semiconductor laser become substantially constant.

2. A laser power controlling device for a semiconductor laser, comprising:
   a serial circuit of an output transistor and a semiconductor laser;
   a variable power source that applies a variable power source voltage to the serial circuit;
   a peak hold circuit that obtains the peak hold voltage of an operating voltage of the semiconductor laser; and
   control means that controls the variable power source device such that a difference voltage between the variable power source voltage and the peak hold voltage become a substantially constant voltage.

3. The laser power controlling device for a semiconductor laser according to claim 2, wherein
   said control means is a micro-computer.

4. The laser power controlling device for a semiconductor laser according to claim 2, wherein
   said control means is a subtraction circuit that subtracts the peak hold voltage of said peak hold circuit from the variable power source voltage of said variable power source device.

5. The laser power controlling device for a semiconductor laser according to claim 2, wherein
   said variable power source device is a DC—DC converter.

6. The laser power controlling device for a semiconductor laser according to claim 2, wherein
   said variable power source device is a boosting type DC—DC converter.

7. The laser power controlling device for a semiconductor laser according to claim 2, wherein
   said variable power source device is a series regulator.

8. The laser power controlling method for a semiconductor laser according to claim 1, wherein
   said semiconductor laser is a high-output purple color semiconductor laser.

9. The laser power controlling device for a semiconductor laser according to claim 2, wherein
   said semiconductor laser is a high-output purple color semiconductor laser.

10. A method for at least one of recording to and reproducing from a magneto-optical recording medium, in which a convergent laser light based on a laser light from a semiconductor laser is radiated onto a magneto-optical recording medium to heat the magneto-optical recording medium;
    a magnetic field based on recording information is applied to the heated portion of the magneto-optical recording medium to thereby record the recording information into the heated portion thereof; and
    a convergent laser light based on a laser light from the semiconductor laser is radiated onto the magneto-optical recording medium having the information recorded therein to thereby reproduce the information by using the laser light emitted from the magneto-optical recording medium having the information recorded therein, comprising the steps of:
    applying a variable power source voltage to a serial circuit of an output transistor and a semiconductor laser;
    obtaining a peak hold voltage of an operating voltage of the semiconductor laser; and
    controlling the variable power source voltage such that a difference between the variable power source voltage and the peak hold voltage of the operating voltage of said semiconductor laser becomes substantially constant.

11. An apparatus for at least one of recording to and reproducing from a magneto-optical recording medium which includes an optical head that emits a convergent laser light based on a laser light from a semiconductor laser and magnetic field generator means that applies a magnetic field based on recording information to a magneto-optical recording medium; the convergent laser light from the optical head is radiated onto the magneto-optical recording medium to heat the magneto-optical recording medium and the magnetic field from the magnetic field generator means is applied to the heated portion of the magneto-optical recording medium to thereby record the information; and a convergent laser light from the optical head is radiated onto the magneto-optical recording medium having the information recorded therein to thereby obtain from the optical head a reproduction information signal based on an emitted laser light from the magneto-optical recording medium having the information recorded therein, comprising:
    a serial circuit of an output transistor and the semiconductor laser;
    a variable power source device that applies a variable power source voltage to the serial circuit;
    a peak hold circuit that obtains the peak hold voltage of an operating voltage of the semiconductor laser;
    control means that controls the variable power source voltage such that a difference voltage between the variable power source voltage and the peak hold voltage become substantially constant.

12. The method for at least one of recording to and reproducing from a magneto-optical recording medium according to claim 10, wherein the control voltage of said driving circuit for driving the semiconductor laser, at the time of recording, is a pulse voltage having one certain amplitude voltage and, at the time of reproduction, is another certain constant voltage lower in amplitude than said one certain amplitude voltage.

13. The apparatus for at least one of recording to and reproducing from a magneto-optical recording medium according to claim 11, wherein
    the control voltage of said driving circuit for driving the semiconductor laser, at the time of recording, is a pulse voltage having one certain amplitude voltage and, at the time of reproduction, is another certain constant voltage lower in amplitude than said one amplitude voltage.

14. The apparatus for at least one of recording to and reproducing from a magneto-optical recording medium according to claim 11, wherein
    said control means includes a micro-computer.

15. The apparatus for at least one of recording to and reproducing from a magneto-optical recording medium according to claim 11, wherein
said control means includes a subtraction circuit that subtracts the peak hold voltage of said peak hold circuit from the variable power source voltage of said variable power source device.

16. The apparatus for at least one of recording to and reproducing from a magneto-optical recording medium according to claim 11, wherein
said variable power source device is a DC—DC converter.

17. The apparatus for at least one of recording to and reproducing from for a magneto-optical recording medium according to claim 11, wherein
said variable power source device is a boosting type DC—DC converter.

18. The apparatus for at least one of recording to and reproducing from a magneto-optical recording medium according to claim 11, wherein
said variable power source device is a series regulator.

19. The method for at least one of recording to and reproducing from a magneto-optical recording medium according to claim 10, wherein
said semiconductor laser is a high-output purple color semiconductor laser.

20. The apparatus for at least one of recording to and reproducing from a magneto-optical recording medium according to claim 11, wherein
said semiconductor laser is a high-output purple color semiconductor laser.

21. A method for at least one of recording to and reproducing from an optical recording medium, in which a convergent laser light, based on a laser light from a semiconductor laser, which is optically modulated by information is irradiated onto an optical recording medium to thereby record the information; a convergent laser light based on a laser light from the semiconductor laser is irradiated onto the optical recording medium having the information recorded therein to thereby reproduce the information in accordance with an emitted laser light from the optical recording medium having the information recorded therein, comprising the steps of:
applying a variable power source voltage to a serial circuit of an output transistor and the semiconductor laser;
obtaining a peak hold voltage of an operating voltage of the semiconductor laser: and
controlling the variable power source voltage such that the voltage difference between the variable power source voltage and the peak hold voltage of the operating voltage of the semiconductor laser become substantially constant.

22. A apparatus for at least one of recording to and reproducing from an optical recording medium which includes an optical head that emits a convergent laser light, based on a laser light from a semiconductor laser, which is optically modulated by information and a convergent laser light which is not optically modulated by information, whereby, by irradiating onto an optical recording medium the convergent laser light of the laser light optically modulated by information from the optical head, the information is recorded and, by irradiating onto the information-recorded optical recording medium the convergent laser light which is not optically modulated by information from the optical head, a reproduction information signal based on the laser light emitted from the information-recorded optical recording medium is obtained by the optical head, comprising:
a serial circuit of an output transistor and the semiconductor laser;
a variable power source device that applies a variable power source voltage to said serial circuit;
a peak hold circuit that obtains the peak hold voltage of an operating voltage of said semiconductor laser; and
control means that controls the variable power source voltage such that a difference voltage between the variable power source voltage and the peak hold voltage become substantially constant.

23. The method for at least one of recording to and reproducing from an optical recording medium according to claim 22, wherein
the control voltage of said driving circuit for driving the semiconductor laser, at the time of recording, is a pulse voltage having one certain amplitude voltage and, at the time of reproduction, is another certain constant voltage lower in amplitude than said one certain amplitude voltage.

24. The apparatus for at least one of recording to and reproducing from an optical recording medium according to claim 22, wherein
the control voltage of said driving circuit for driving -the semiconductor laser, at the time of recording, is a pulse voltage having one certain amplitude voltage and, at the time of reproduction, is another certain constant voltage lower in amplitude than said one certain amplitude voltage.

25. The apparatus for at least one of recording to and reproducing from an optical recording medium according to claim 22, wherein
said control means is a micro-computer.

26. The apparatus for at least one of recording to and reproducing from an optical recording medium according to claim 22, wherein
said control means is a subtraction circuit that subtracts the peak hold voltage of said peak hold circuit from the variable power source voltage of said variable power source device.

27. The apparatus for at least one of recording to and reproducing from an optical recording medium according to claim 22, wherein
said variable power source device is a DC—DC converter.

28. The apparatus for at least one of recording to and reproducing from an optical recording medium according to claim 22, wherein
said variable power source device is a boosting type DC—DC converter.

29. The apparatus for at least one of recording to and reproducing from an optical recording medium according to claim 22, wherein
said variable power source device includes a series regulator.

30. The method for at least one of recording to and reproducing from an optical recording medium according to claim 21, wherein
said semiconductor laser is a high-output purple color semiconductor laser.

31. The apparatus for at least one of recording to and reproducing from an optical recording medium according to claim 22, wherein
said semiconductor laser is a high-output purple color semiconductor laser.

* * * * *